(12) United States Patent
Sarin et al.

(10) Patent No.: US 8,565,024 B2
(45) Date of Patent: *Oct. 22, 2013

(54) SENSING MEMORY CELLS

(75) Inventors: Vishal Sarin, Cupertino, CA (US);
Frankie F. Roohparvar, Monte Sereno, CA (US); Jung Sheng Hoei, Newark, CA (US); Giulio-Giuseppe Marotta, Contigliano (IT)

(73) Assignee: Micron Technology, Inc., Boise, ID (US)

( * ) Notice: Subject to any disclaimer, the term of this patent is extended or adjusted under 35 U.S.C. 154(b) by 234 days.

This patent is subject to a terminal disclaimer.

(21) Appl. No.: 13/114,640

(22) Filed: May 24, 2011

(65) Prior Publication Data

US 2011/0249507 A1   Oct. 13, 2011

Related U.S. Application Data

(63) Continuation of application No. 11/999,359, filed on Dec. 4, 2007, now Pat. No. 7,948,802.

(51) Int. Cl.
*G11C 11/34* (2006.01)
(52) U.S. Cl.
USPC .................. 365/185.19; 365/185.22; 341/155
(58) Field of Classification Search
USPC ............ 365/185.19, 185.22, 230.03, 185.18, 365/185.17, 185.23; 341/155, 118, 120, 341/169, 170, 158
See application file for complete search history.

(56) References Cited

U.S. PATENT DOCUMENTS

| | | | |
|---|---|---|---|
| 4,404,655 | A | 9/1983 | Naiff |
| 5,508,958 | A | 4/1996 | Fazio et al. |
| 5,638,320 | A | 6/1997 | Wong et al. |
| 5,751,635 | A | 5/1998 | Wong et al. |
| 6,011,715 | A | 1/2000 | Pasotti et al. |
| 6,154,157 | A | 11/2000 | Wong |
| 6,233,173 | B1 | 5/2001 | Chevallier et al. |
| 6,392,931 | B1 | 5/2002 | Pasotti et al. |
| 6,614,683 | B1 | 9/2003 | Parker |
| 6,856,546 | B2 | 2/2005 | Guterman et al. |
| 7,054,197 | B2 | 5/2006 | Vimercati |
| 7,197,607 | B2 | 3/2007 | Roohparvar |
| 7,227,488 | B2 | 6/2007 | Cho |

(Continued)

FOREIGN PATENT DOCUMENTS

| | | |
|---|---|---|
| JP | 06-083716 | 3/1994 |
| JP | 08-274282 | 10/1996 |

(Continued)

OTHER PUBLICATIONS

European Search Report for related European Application No. 08856920.7 dated Jun. 24, 2011 (6 pages).

(Continued)

*Primary Examiner* — Dang Nguyen
(74) *Attorney, Agent, or Firm* — Brooks, Cameron & Huebsch, PLLC

(57) ABSTRACT

The present disclosure includes methods, devices, modules, and systems for operating memory cells. One method embodiment includes applying a ramping voltage to a control gate of a memory cell and to an analog-to-digital converter (ADC). The aforementioned embodiment of a method also includes detecting an output of the ADC at least partially in response to when the ramping voltage causes the memory cell to trip sense circuitry.

20 Claims, 9 Drawing Sheets

(56) References Cited

U.S. PATENT DOCUMENTS

| | | |
|---|---|---|
| 7,751,253 B2 | 7/2010 | Sarin et al. |
| 7,768,832 B2 | 8/2010 | Roohparvar et al. |
| 7,782,674 B2 | 8/2010 | Roohparvar et al. |
| 7,864,589 B2 | 1/2011 | Sarin et al. |
| 7,898,885 B2 | 3/2011 | Sarin et al. |
| 7,903,461 B2 | 3/2011 | Chandrasekhar et al. |
| 7,948,802 B2 * | 5/2011 | Sarin et al. ............... 365/185.19 |
| 2002/0184432 A1 | 12/2002 | Ban |
| 2004/0085463 A1 | 5/2004 | Sharma et al. |
| 2006/0028872 A1 | 2/2006 | Rolandi et al. |
| 2006/0106972 A1 | 5/2006 | Gorobets et al. |
| 2006/0250852 A1 | 11/2006 | Vimercati et al. |
| 2007/0076505 A1 | 4/2007 | Radtke et al. |
| 2007/0204180 A1 | 8/2007 | Huang et al. |
| 2007/0262890 A1 | 11/2007 | Cornwell et al. |
| 2008/0313505 A1 | 12/2008 | Lee et al. |
| 2009/0067251 A1 | 3/2009 | Sarin et al. |
| 2009/0094409 A1 | 4/2009 | Yeh et al. |

FOREIGN PATENT DOCUMENTS

| | | |
|---|---|---|
| JP | 10-116495 | 6/1998 |
| JP | 10-162593 | 6/1998 |
| JP | 2000-066949 | 3/2000 |
| JP | 2004-087002 | 3/2004 |
| JP | 2004-355726 | 12/2004 |
| JP | 2006-114078 | 4/2006 |
| JP | 2007-164865 | 6/2007 |
| JP | 2007-250173 | 9/2007 |
| WO | 96/10256 | 4/1996 |
| WO | 2006/080063 | 3/2006 |
| WO | 2007/134277 | 11/2007 |
| WO | 2007134188 A2 | 11/2007 |

OTHER PUBLICATIONS

Japanese Notice of Rejection Grounds for related JP Application No. 2010-536916, mailed Aug. 7, 2012, (4 pages).

International Search Report and Written Opinion for related PCT Application Serial No. PCT/US2008/013255, mailed Jun. 29, 2009 (14 pages).

International Search Report and Written Opinion for related PCT Application No. PCT/US2010/001669, mailed Jan. 28, 2011 (14 pages).

* cited by examiner

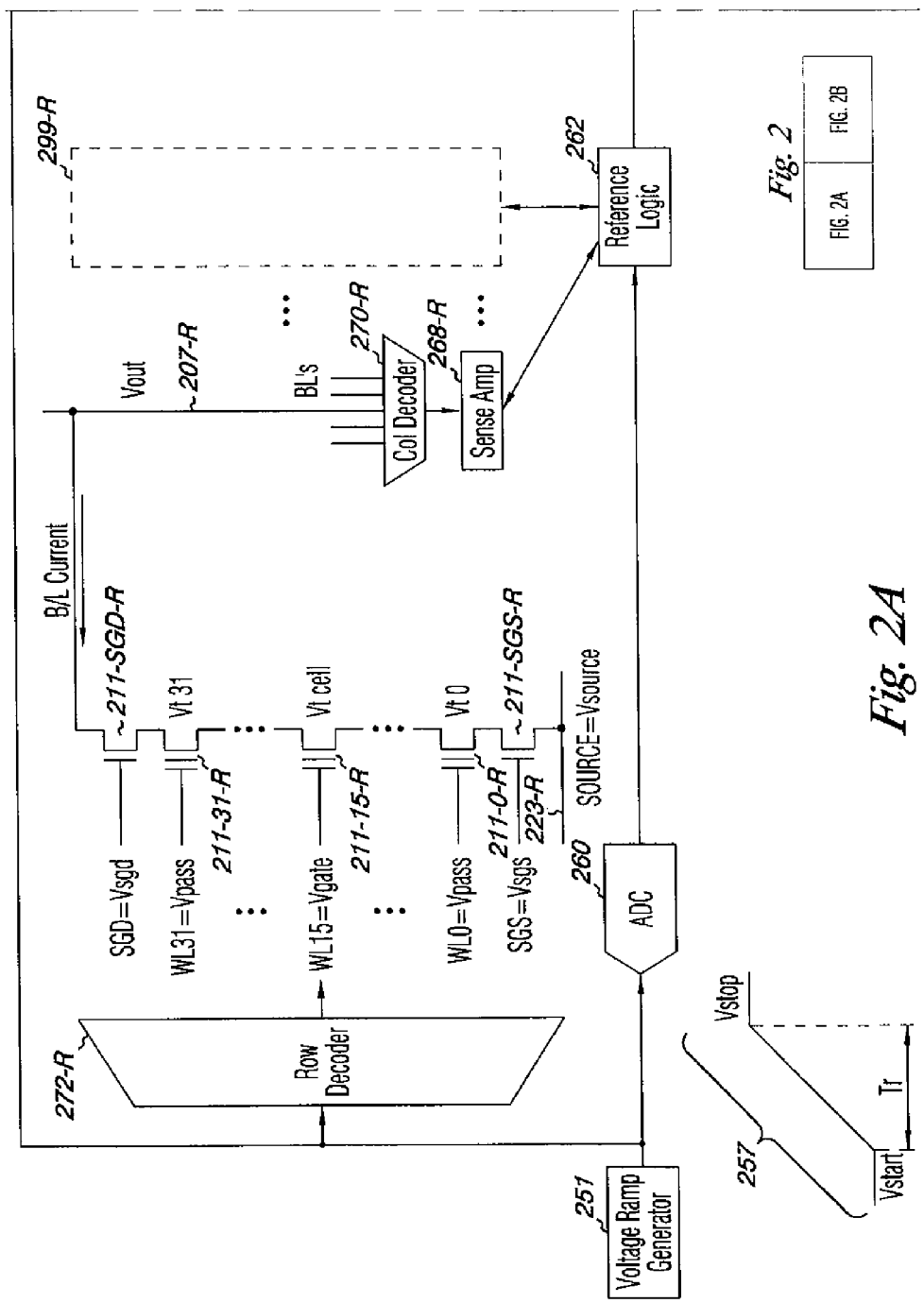

8,565,024 B2

SENSING MEMORY CELLS

CROSS REFERENCE TO RELATED APPLICATION

This application is a continuation of U.S. application Ser. No. 11/999,359, filed Dec. 4, 2007, now U.S. Pat. No. 7,948, 802 the entire specification of which in incorporated herein by reference.

TECHNICAL FIELD

The present disclosure relates generally to semiconductor devices and, more particularly, in one or more embodiments, to sensing multilevel memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to select lines. However each memory cell is not directly coupled to a column sense line by its drain. Instead, the memory cells of the array are coupled together in series, source to drain, between a source line and a column sense line.

Memory cells in a NAND array architecture can be programmed to a desired state. That is, electric charge can be placed on or removed from the floating gate of a memory cell to put the cell into a number of stored states. For example, a single level cell (SLC) can represent two digit, e.g., binary, states, e.g., 1 or 0. Flash memory cells can also store more than two digit states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multidigit cells, or multilevel cells (MLCs). MLCs can allow the manufacture of higher density memories without increasing the number of memory cells since each cell can represent more than one digit, e.g., bit. MLCs can have more than one programmed state, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

Sensing operations, such as read operations and program verify operations, can involve applying a potential to a control gate of a selected memory cell and determining whether or not the cell conducts according to a sense line current. For MLCs, such a sensing operation can require the application of multiple potentials. For example, an MLC capable of being programmed to sixteen states can require the application of fifteen different potentials to a control gate to sense the state of the cell. Each potential applied to the control gate is applied for a period of time, for example, 10 to 20 microseconds, while the line carrying the current settles. For a cell requiring the application of fifteen sensing potentials, the result can include a 300 microsecond sensing time.

Other sensing operations employing the use of a voltage ramp, rather than discrete sensing voltages, can result in erroneous results due to variations in ramp rate and distortions in ramp value that can occur with process cycling and changing temperature. As voltage is applied to a control gate of a selected memory cell, an amount of time is required for the cell to conduct. If a voltage ramp increases too quickly, the selected cell may not have time to conduct charge sufficient to trip a sense amplifier before the voltage ramp reaches a higher level corresponding to a higher program state. In such a situation, a sensing operation could erroneously report that the cell has been programmed to a higher state.

BRIEF DESCRIPTION OF THE DRAWINGS

FIGS. 2A and 2B illustrate a schematic diagram of a sensing circuit in accordance with one or more embodiments of the present disclosure.

DETAILED DESCRIPTION

One or more embodiments of the present disclosure provide methods, devices, and systems for operating memory cells. One method embodiment includes applying a ramping voltage to a control gate of a memory cell and to an analog-to-digital converter (ADC). The aforementioned embodiment of a method also includes detecting an output of the ADC at least partially in response to when the ramping voltage causes the memory cell to trip sense circuitry.

In the following detailed description of the present disclosure, reference is made to the accompanying drawings that form a part hereof, and in which is shown by way of illustration how some embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

Figure 1:
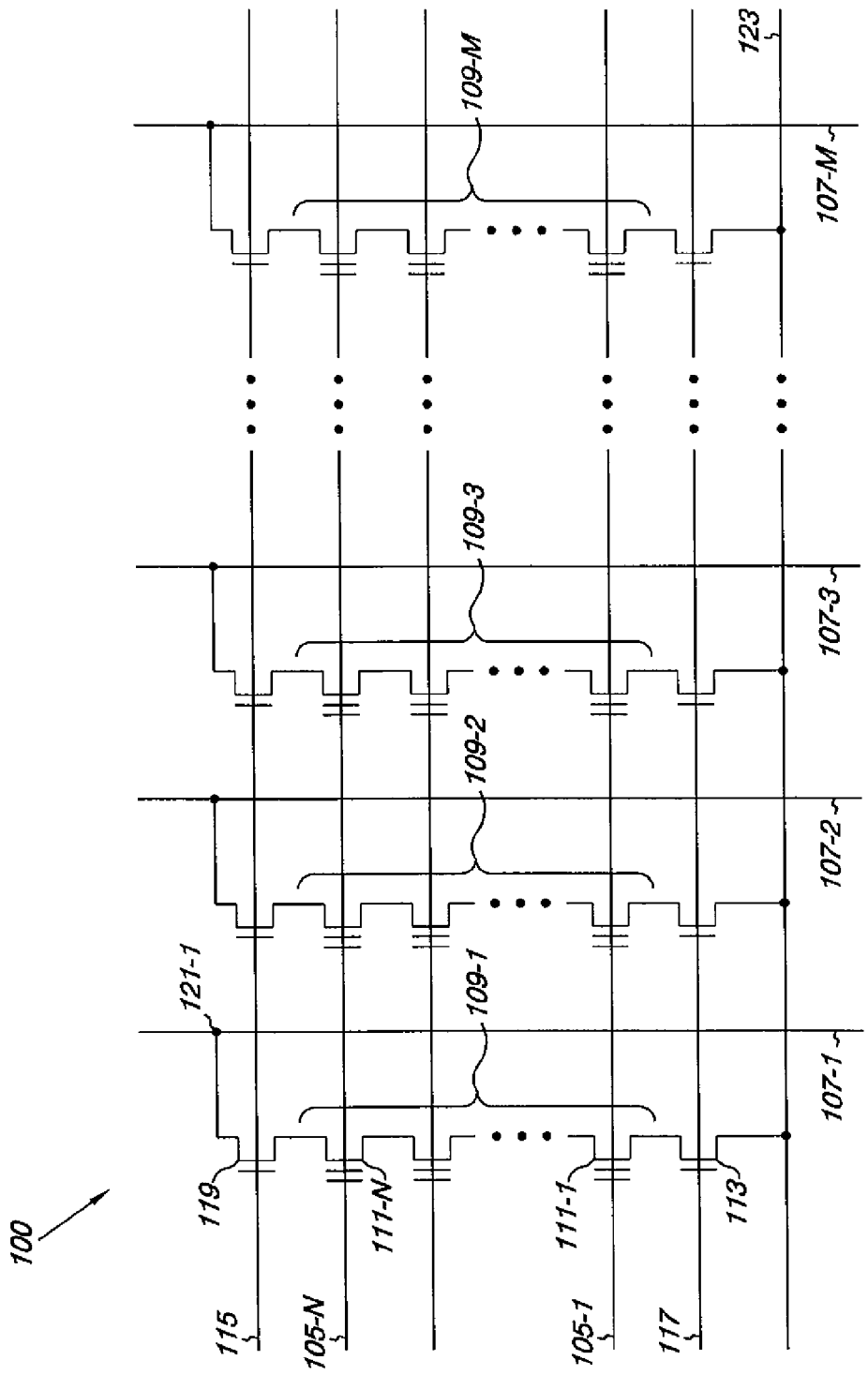
FIG. 1 is a schematic of a portion of a non-volatile memory array that can be used with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes select lines 105-1, . . . , 105-N and intersecting sense lines 107-1, . . . , 107-M. For ease of addressing in the digital environment, the number of select lines 105-1, . . . , 105-N and the number of sense lines 107-1, . . . , 107-M are each some power of two, e.g., 256 select lines by 4,096 sense lines.

Memory array 100 includes NAND strings 109-1, . . . , 109-M. Each NAND string includes non-volatile memory cells 111-1, . . . , 111-N, each located at an intersection of a select line 105-1, . . . , 105-N and a local sense line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In some embodiments, construction of non-volatile memory cells, 111-1, . . . , 111-N, includes a source, a drain, a floating gate or other charge storage layer, and a control gate. Non-volatile memory cells, 111-1, . . . , 111-N, have their control gates coupled to a select line, 105-1, . . . , 105-N respectively. A column of the non-volatile memory cells, 111-1, . . . , 111-N, make up the NAND strings, e.g., 109-1, . . . , 109-M, coupled to a given local sense line, e.g., 107-1, . . . , 107-M respectively. A row of the non-volatile memory cells are commonly coupled to a given select line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected select line, e.g., 105-1, . . . , 105-N, can be programmed and/or sensed together as a group. A programming operation, e.g., a write operation, can include applying a number of program pulses, e.g., 16V-20V, to a selected select line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. The sensing operation can involve biasing a sense line, e.g., sense line 107-1, associated with a selected memory cell at a voltage above a bias voltage for a source line, e.g., source line 123, associated with the selected memory cell.

Sensing the state of a selected cell can include applying a sensing voltage ramp, e.g., −2V to +3V, to a selected select line, while biasing the unselected cells of the string at a voltage, e.g., 4.5V, "Vpass", sufficient to place the unselected cells in a conducting state independent of the threshold voltage of the unselected cells. Alternatively, sensing the state of a selected cell could include applying discrete sensing voltages, e.g., −0.05V, 0.5V, and 2V, to a selected select line, and thus to the control gate of a selected cell. The sense line corresponding to the selected cell being read and/or verified can be sensed to determine whether or not the selected cell conducts in response to the particular sensing voltage applied to the select line. For example, the state of a selected cell can be determined by the select line voltage at which the sense line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the bit line corresponding to the string. For instance, data stored in the selected cell can be based on whether the bit line current changes by a particular amount or reaches a particular level in a given time period.

When the selected cell is in a conductive state, current flows between the source line contact at one end of the string and a sense line contact at the other end of the string. As such, the current associated with sensing the selected cell is carried through each of the other cells in the string, the diffused regions between cell stacks, and the select transistors. When a ramping, e.g., increasing, voltage applied to a select line causes a selected cell to conduct, sense circuitry, e.g., an amplifier, associated with the cell can be tripped, allowing further operations to be performed as described below.

Figure 2B:
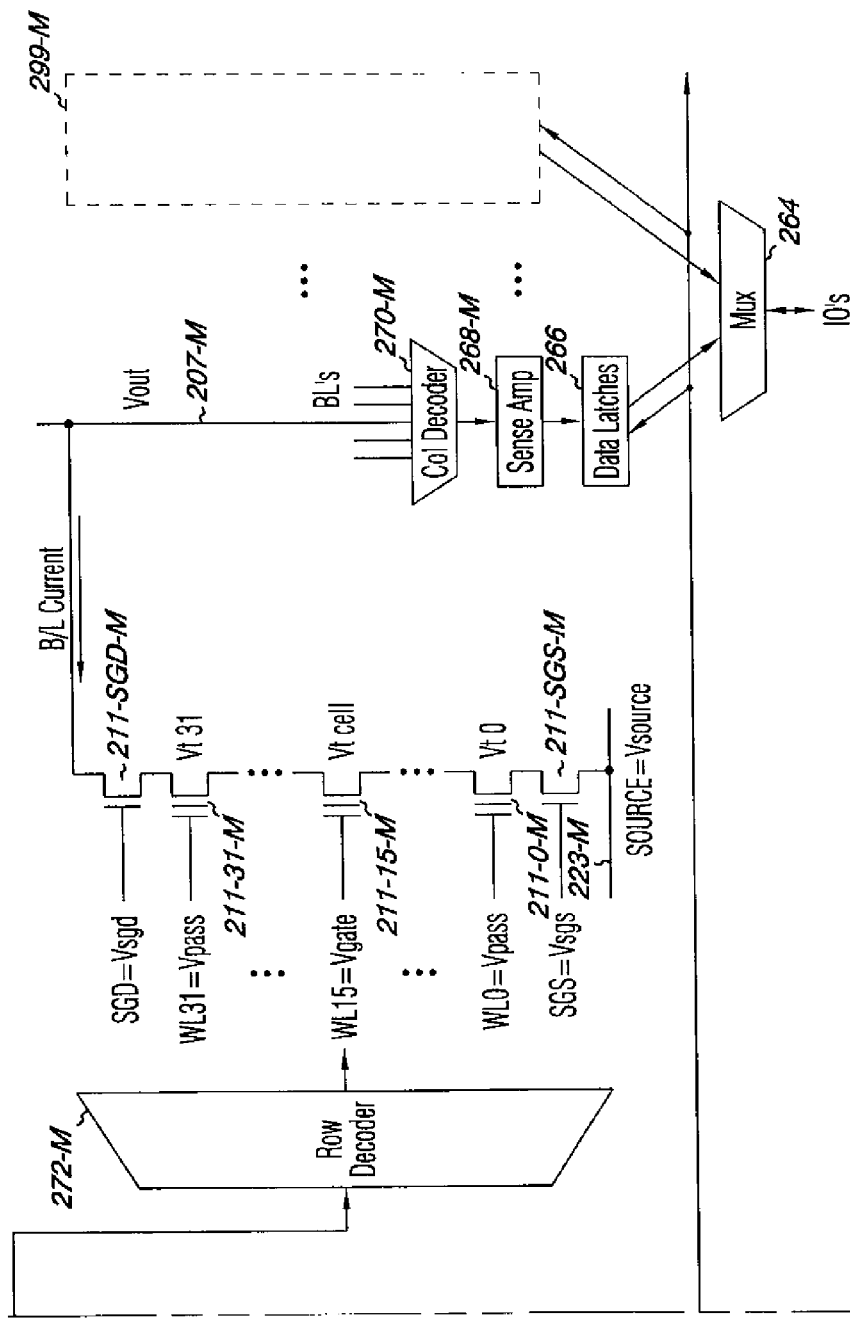

FIGS. 2A and 2B illustrate a schematic diagram of a sensing circuit in accordance with one or more embodiments of the present disclosure. The schematic illustrated in FIGS. 2A and 2B includes a voltage ramp generator 251 for generating a voltage ramp 257 that is output to an analog-to-digital converter (ADC) 260, and to a number of reference cells via a row decoder 272-R, and a number of memory cells via row decoder 272-M. As used herein, "cell" or "cells" refers generically to either reference or memory cells.

The voltage ramp generator 251 can increase a voltage 257 in accordance with a linear slope from a starting voltage (Vstart) to a stopping voltage (Vstop) in a period of time Tr. The starting and stopping voltages can be selected to encompass the range of threshold voltages to which cells in a given array can be programmed, e.g., −2V to +3V. In this manner, the voltage 257 can provide sensing capability for any program state of a selected cell with a single input. The period of ramping can be selected to balance efficient sensing speeds with accurate detection of a threshold voltage (Vt). In one or more embodiments, Tr can be less than 20 microseconds. Further discussion of the use of a voltage ramp in the operation of memory cells can be found in commonly assigned U.S. patent application Ser. No. 11/879,907, entitled "Analog Sensing of Memory Cells in a Solid State Memory Device", including at least one common inventor, Vishal Sarin, filed Jul. 19, 2007. Further discussion of the period of ramp voltage 257, is provided in connection with FIG. 3 below.

As the reader will appreciate, sense line 207-R can be coupled to any number of reference cells and sense line 207-M can be coupled to any number of memory cells. In the embodiment illustrated in FIGS. 2A and 2B, 32 reference cells are coupled to sense line 207-R between source select gate 211-SGS-R and drain select gate 211-SGD-R, while 32 memory cells are coupled to sense line 207-R between source select gate 211-SGS-R and drain select gate 211-SGD-R. The embodiment illustrated in FIG. 2A also includes source select gate 211-SGS-R having a source coupled to common source line 223-R, where a voltage "Vsource" can be applied. Likewise, FIG. 2B includes source select gate 211-SGD-M having a source coupled to a common source line 223-M. Source lines 223-R and 223-M can be referred to as common source lines because they can be coupled to other sense lines in the array, e.g., other sense lines which may also be coupled to column decoder 270-R or 270-M. As will be appreciated by one of ordinary skill in the art, in embodiments including strings of reference cells and memory cells located in the same array, they could share one common source line, such as source line 223-R.

In the embodiment illustrated in FIGS. 2A and 2B, a number of reference cells, e.g., 211-0-R, ..., 211-15-R, ..., 211-31-R, can be programmed to each of a number of states to which memory cells, e.g., 211-0-M, ..., 211-15-M, ..., 211-31-M, can be programmed. In some embodiments, reference cells on each string of reference cells could be programmed to a same state. Such embodiments could include at least one string of reference cells for each programmable state. In some embodiments, reference cells programmed to each state can be interleaved throughout the array of memory cells, e.g., individual reference cells can be located on different strings of memory cells. In some embodiments, reference cells can be located in the array of memory cells, e.g. coupled to sense lines dedicated to reference cells and coupled to select lines dedicated to both memory cells and reference cells. In some embodiments, reference cells can be interleaved throughout the array of memory cells, either in separate reference strings, or as individual reference cells located on a string of memory cells. Reference cells interleaved in an array of memory cells is described in more detail in copending, commonly assigned U.S. patent application Ser. No. 11/799,658, entitled "Non-Volatile Multilevel Memory Cells with Data Read of Reference Cells", including at least one common inventor, filed May 2, 2007. As used in connection with FIGS. 2A, 2B, and 3, "string" means a number of cells coupled to a sense line, e.g., 207-R. A string of cells could include a number of non-volatile cells coupled in series on a sense line, e.g., bit-line, such as in a NAND flash array.

Column decoders ("Col Decoder") 270-R and 270-M are each connected to a number of sense lines, e.g., bit lines ("BL's"). Included in the BL's is sense line 207-R for the reference cells, e.g., 211-15-R and 207-M for the memory cells, e.g., 211-15-M. Elements 299-R and 299-M reflect that, in addition to multiple numbers of sense lines, an array of reference cells can include multiple numbers of column decoders and sense amps. Only one set of each is presented in FIGS. 2A and 2B for ease of illustration. Elements 299-R and 299-M also indicate that there can be multiple strings of both reference cells and memory cells for a given memory device. One string of each is presented in FIGS. 2A and 2B for ease of illustration.

The select line, e.g. word line, voltage ramp generator 251 can apply a voltage ramp 257 to a select line, e.g. WL15, and thus the control gate of a selected cell, e.g., 211-15-M. According to this embodiment, the state, e.g. "Vt cell", of the cell can be sensed by detecting changes to the current "B/L Current" and/or voltage "Vout" in a sense line, e.g., 207-M using a sense amplifier, e.g., 268-M, via a column decoder, e.g., 270-M. The voltage ramp generator 251 can function to ramp the voltage 257 to the point where the applied voltage reaches the Vt of the selected cell, at which point the cell conducts, e.g., is put into a conductive state. When the selected cell is in a conductive state, current flows between the source line, e.g., 273-M, and the sense line, e.g., 207-M. As such, the current associated with reading the selected cell is carried through each of the other cells in the string, the diffused regions between cell stacks, and the select transistors. This current can trip a sense amplifier, e.g., 268-M.

As is also indicated in the embodiment illustrated in FIGS. 2A and 2B, select lines, e.g., WL0 and WL31, for non-selected cells, e.g., 211-0-R and 211-0-M, have a pass voltage (Vpass) applied during the sensing operation so that they are in a conductive state. In this embodiment, the select gate source (SGS) 211-SGS-M and select gate drain (SGD) 211-SGD-M are biased at Vsgs and Vsgd respectively.

In the embodiment of FIG. 2A, when a reference sense amplifier 268-R trips, it can indicate to reference logic 262 that a reference cell has reacted to input from a voltage ramp generator by conducting. Reference logic 262 can accept input from both sense amplifiers, e.g. 268-R, and ADC 260. Reference logic can operate to adjust an ADC 260 output when a particular percentage of the number of reference cells react by conducting. Reference logic 262 can adjust ADC 260 output to reflect a specific data value for a particular state. Reference logic, e.g. reference cell based conversion logic, can detect memory cell data and compensate for systematic disturb and other sensing error inducing mechanisms.

As the reader will appreciate, program algorithms may include a variance in the voltage level to which cells are programmed. Cells are typically programmed within a certain range. The range of programming values for a particular state among a number of cells programmed to the particular state can create inaccuracies in reading. Furthermore, other factors can contribute to programming and sensing inaccuracies. For example, time, temperature fluctuations, program and erase cycling, and capacitive coupling, among other factors, can contribute to changes in the amount of charge stored on a given cell.

For example, a particular state may be associated with a voltage of +0.5V. A number of reference cells, e.g., 100, may be programmed to the particular state. Reference cells, e.g., 211-15-R, can be programmed during the same programming operation as memory cells, e.g., 211-15-M. To help account for programming and sensing inaccuracies described above, a percentage, e.g., 90%, of reference cells programmed to a particular state can be considered sufficient for establishing accurate sensing for the particular state. As the voltage applied to the 100 reference cells ramps up, an increasing number of the reference cells can conduct. When, for example, 90 of the 100 reference cells conduct, at, for example, +0.45V, reference logic 262 can adjust the ADC 260 output to reflect a data value associated with the particular state. That is, ADC 260, for an input of +0.45V from voltage ramp generator 251 could, without adjustment, output a data value inconsistent with a desired data value for the particular state associated with +0.5V. Reference logic 262 can adjust the ADC 260 output such that, for a voltage input of +0.45V, it outputs a data value associated with +0.5V. The output of ADC 260, as adjusted by reference logic 262, can be input to data latches, e.g., 266.

In the embodiment of FIG. 2B, data latches 266 receive the adjusted ADC 260 output. At this point in time, if selected memory cell 211-15-M trips a sense amplifier 268-M, e.g., if selected memory cell 211-15-M achieves a sense point and conducts for the input from voltage ramp generator 251 that caused the particular percentage of reference cells to conduct, then the adjusted output of ADC 260 is latched as data for the selected memory cell 211-15-M. Here, the adjusted output of ADC 260 is latched as data rather than latching an analog or digital value associated with the charge actually stored in memory cell 211-15-M. The latched value from ADC 260 can be output to multiplexer "Mux" 264, which can be in bidirectional communication with various input-output circuits "IO's" as indicated in FIG. 2B. Furthermore, multiplexer 264 can be in communication with multiple numbers of data latches and associated circuitry and memory cells as indicated by element 299-M.

As will be understood by one of ordinary skill in the art, the embodiment of FIGS. 2A and 2B can be implemented in a mariner to allow one ADC 260 to provide an input for all data latches 266 for a page of memory cells, e.g., a number of memory cells which are programmed per programming operation. Likewise, reference cells, e.g., 211-15-R, and memory cells, e.g., 211-15-M, can be programmed during the same programming operation. Furthermore, the use of ADC 260 can provide automatic compensation for variations in the ramp period (Tr) of voltage ramp 257 from voltage ramp generator 251.

Figure 3:
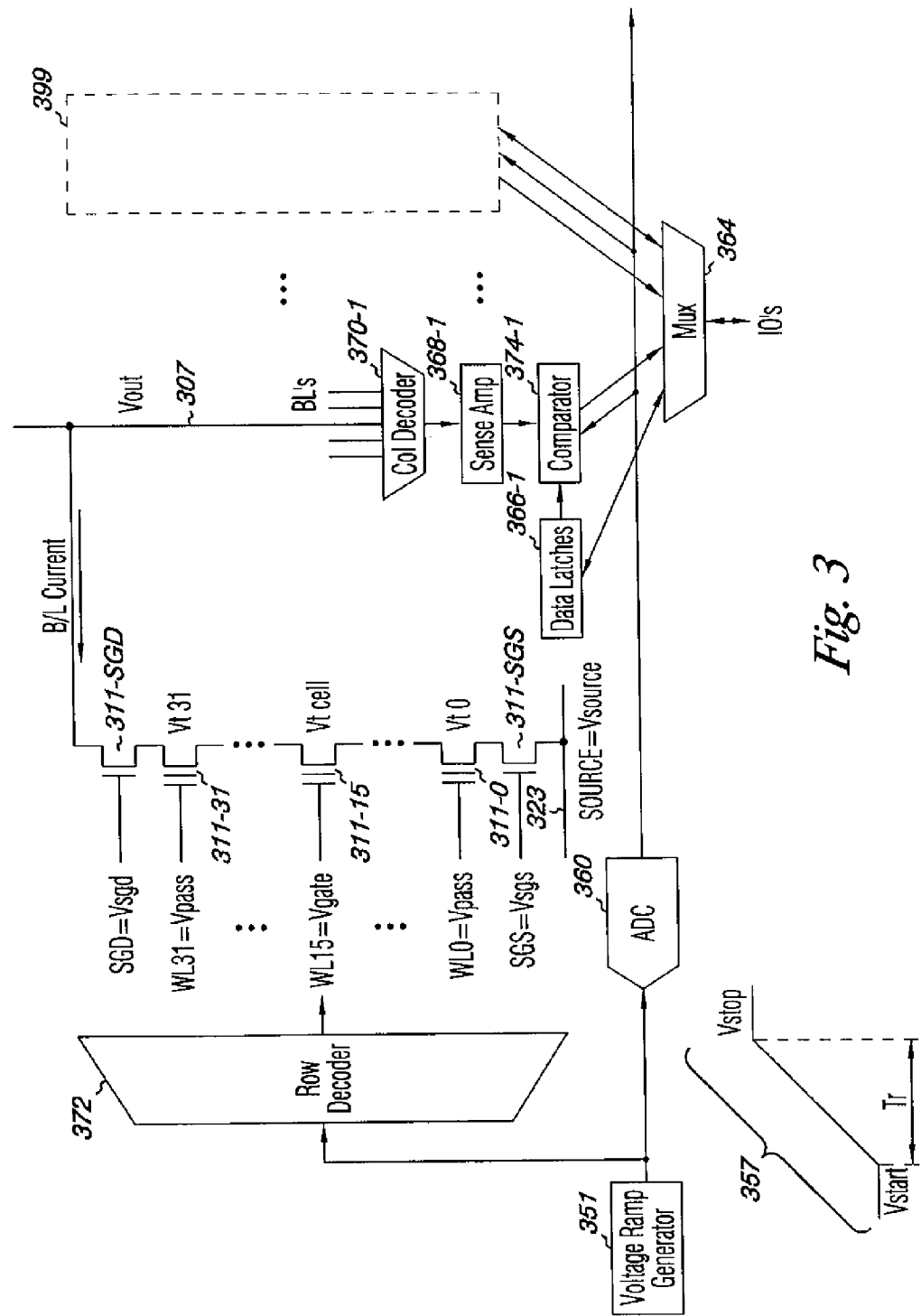
FIG. 3 illustrates a schematic diagram of a sensing circuit in accordance with one ore more embodiments of the present disclosure.

FIG. 3 illustrates a schematic diagram of a sensing circuit in accordance with one ore more embodiments of the present disclosure. The schematic illustrated in FIG. 3 includes a voltage ramp generator 351 for generating a voltage 357 that is output to an analog-to-digital converter (ADC) 360 and to a number of cells via a row decoder 372. The cells illustrated in FIG. 3 can be either reference cells, e.g., 211-15-R in FIG. 2A, or memory cells, e.g., 211-15-M in FIG. 2B.

The voltage ramp generator 351 can increase a voltage 357 with a linear slope from a starting voltage (Vstart) to a stopping voltage (Vstop) in a period of time Tr. In one or more embodiments, the linear slope can be a single linear slope. The starting and stopping voltages 357 can be selected to encompass the range of threshold voltages to which cells in a given array can be programmed, e.g., −2V to +3V. In this manner, the voltage 357 can provide sensing capability for any program state of a selected cell with a single input. The ramping period of voltage 357 can be selected to balance efficient sensing speeds with accurate detection of a threshold voltage (Vt). In one ore more embodiments Tr can be less than 20 microseconds.

In order to reduce the amount of time required to perform a sensing operation, for example, Tr can be set to a relatively short period of time. However, Tr could be set to a period of time short enough to cause sensing errors. Sensing circuitry, such as a sense amplifier, generally requires a period of time in order to detect whether a cell conducts. For example, a finite amount of time may be required to allow for line loading in response to a given input. Tr can be set to a period short enough that voltage 357 can reach a first level, causing a cell programmed to a first state to conduct, and reach a second level associated with a second state before sensing circuitry has time to indicate that the cell programmed to the first state conducts. Thus, when sensing circuitry detects that the first cell is conducting, it could incorrectly read a higher voltage level from voltage 357 associated with a higher state.

Sensing the cell with a ramping voltage 357 can include applying a voltage that increases linearly with time to the control gate of the selected cell, e.g., 311-15. During the sensing operation, unselected cells, e.g., unselected cells coupled to sense line 307 such as 311-SGS, 311-0, 311-31, and 311-SGD, can be biased with a pass voltage, e.g., 4.5V, such that they freely conduct. At some point, as the voltage increases, the selected cell 311-15 can begin to conduct. This point can occur when the voltage ramps up to a level corresponding to the Vt to which the cell is programmed. As the cell begins to conduct, a current passing through a sense line 307 associated with the selected cell 311-15 can change.

As the reader will appreciate, sense line 307 can be coupled to any number of cells. In the embodiment illustrated in FIG. 3, 32 cells are coupled to sense line 307 between source select gate 311-SGS and drain select gate 311-SGD. The embodiment illustrated in FIG. 3 also includes source select gate 311-SGS having a source coupled to common source line 323, where a voltage "Vsource" can be applied. Source line 323 can be referred to as a common source line because it can be coupled to other sense lines in the array, e.g., other sense lines which may also be coupled to column decoder 370-1.

Column decoder ("Col Decoder") 370-1 is included in FIG. 3 connected to a number of sense lines, e.g., bit lines ("BL's"). Included in the BL's is sense line 307, which is also shown connected to a string of cells, including selected cell 311-15. As the reader will appreciate, box 399 reflects that, in addition to multiple numbers of sense lines, an array of cells can include multiple numbers of column decoders, e.g. 370-1, sense amps, e.g., 368-1, comparators, e.g., 374-1, and data latches, e.g., 366-1. Only one set of each is presented in FIG. 3 for ease of illustration.

When sufficient current flows through the sense line 307 to trip a sense amplifier 368-1, a comparator 374-1 can be triggered. The comparator 374-1 can detect the output of a converter, e.g., ADC 360, connected to the voltage ramp generator 351. The comparator can also receive input in the form of information stored in data latches 366-1. Information stored in data latches 366-1 can include the value of the desired program state for the selected cell 311-15. The values from ADC 360 and data latches 366-1 can be used by comparator 374-1 to determine whether the selected cell 311-15 has been programmed to its desired state, e.g., whether the values from ADC 360 and data latch 366-1 correspond. Such a sensing operation can be referred to as a program verify operation, which is described in more detail in connection with FIG. 4 below.

The result of the operation performed by comparator 374-1 can be output through a multiplexer, e.g., Mux 364, to a number of input-output ("IO's") to allow the memory device to perform other operations as will be understood by one of ordinary skill in the art. Furthermore, one of ordinary skill in the art will appreciate that the schematic illustrated in FIG. 3 could be combined with the schematic illustrated in FIGS. 2A and 2B such that one memory device could function to perform the operations embodied by both illustrations. Such a schematic would include bypass circuitry for the reference logic, 262 in FIG. 2A, that could be used during program verify operations.

Figure 4:
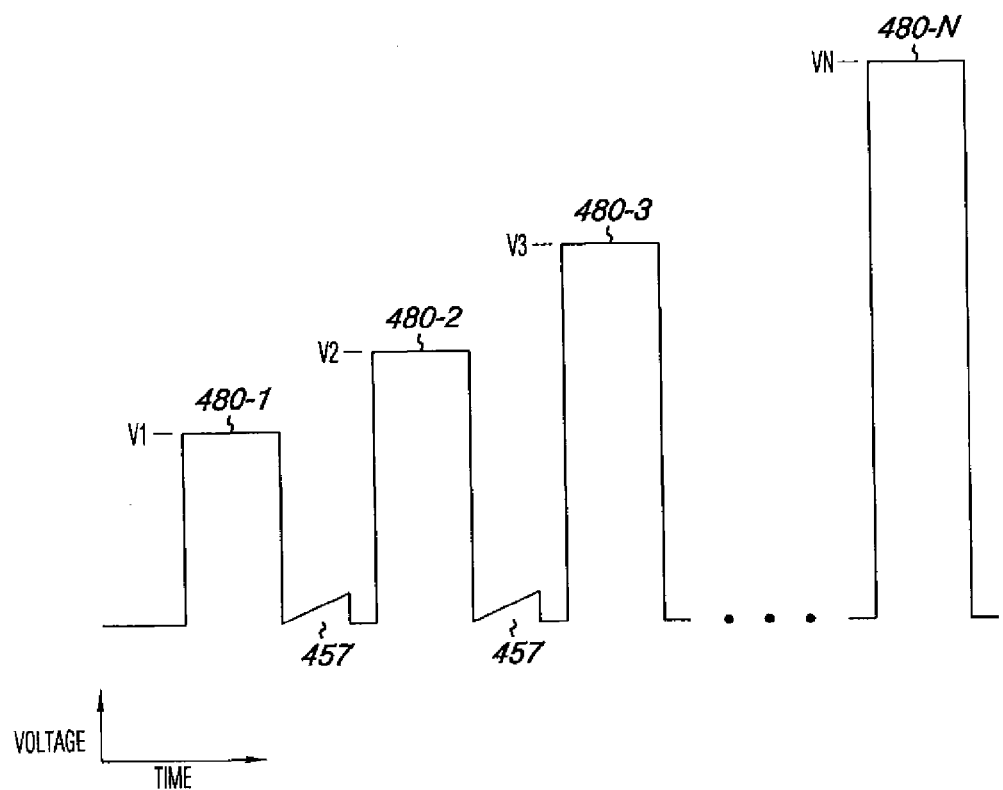
FIG. 4 illustrates a sensing operation in accordance with one or more embodiments of the present disclosure.

FIG. 4 illustrates a sensing, e.g., program verify, operation in accordance with one or more embodiments of the present disclosure. A program verify operation can include sensing a selected cell, e.g., 311-15 in FIG. 3, after applying each of a number of program pulses, e.g., 480-1, 480-2, 480-3, . . . , 480-N, to a select line, e.g., WL15 in FIG. 3. Program pulses can be applied in series, with an increasing voltage level for each pulse, e.g., V1, V2, V3, . . . , VN. Programming pulses are typically applied within a fixed range of voltages, for example, 16V to 20V. Programming pulses are applied to increase the threshold voltage (Vt) of the selected cell to a desired program voltage level corresponding to a desired program state.

In order to determine when a cell has been programmed to a desired state, a sensing operation, e.g., program verify operation, is performed between each programming pulse. In the embodiment illustrated in FIG. 4, the selected cell is sensed with a ramping voltage, e.g., 457, after each programming pulse to determine whether it has been programmed to a desired state. This sensing operation can be performed in a manner substantially similar to the sensing operations described above.

The use of a ramping voltage 457 to sense a cell during a program verify operation can allow verification of the state of the selected cell at any voltage level. The use of ramping voltage 457 to sense a cell during a program verify operation can be advantageous over sensing methods using discrete sensing voltages because those other methods require applying a different voltage level for each desired program state. A ramping voltage 457 can reduce the need for more complex circuitry and sensing time that would be required if the selected cell were verified using discrete program verify voltages for each of the number of program states to which the cell could be programmed. A more detailed description of the circuitry associated with sensing operations, such as program verify operations, is provided above in connection with FIG. 3.

Figure 5A:
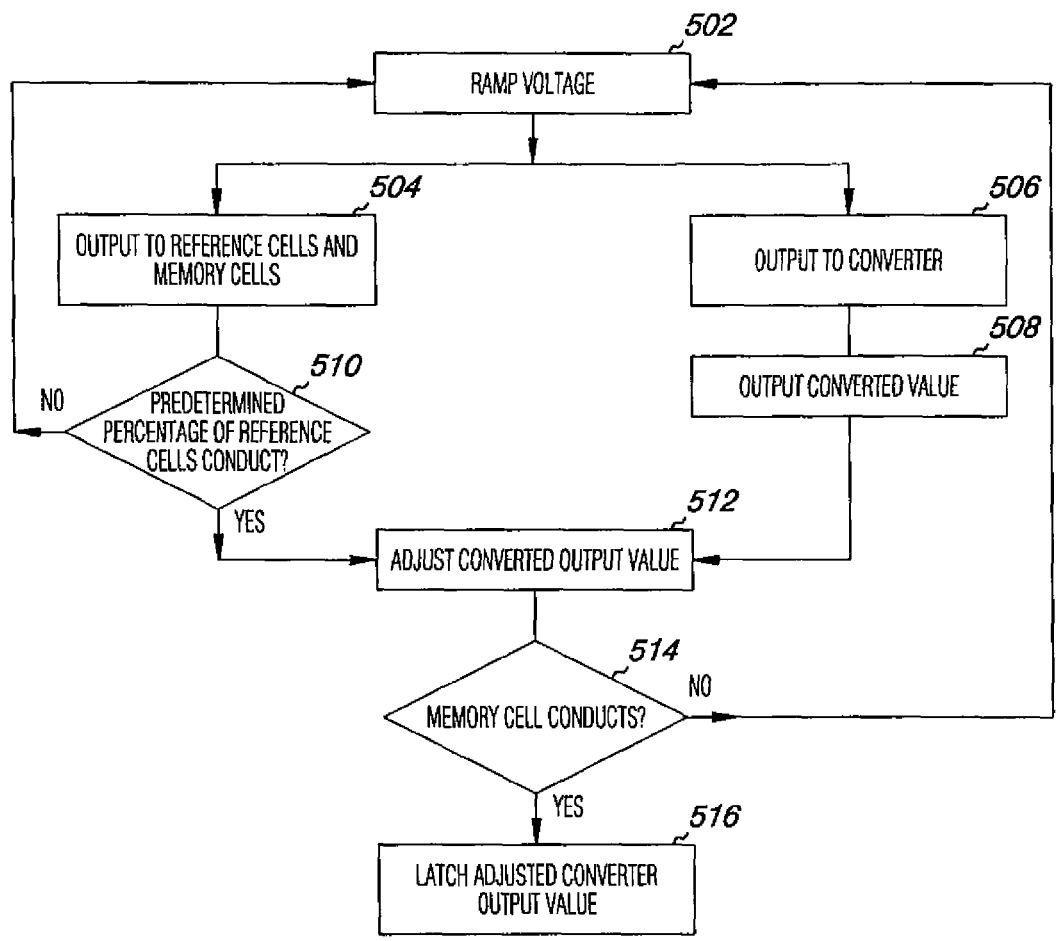
FIG. 5A provides a flow chart illustrating one method for sensing a cell in accordance with one or more embodiments of the present disclosure.

FIG. 5A provides a flow chart illustrating one method for sensing a cell in accordance with one or more embodiments of the present disclosure. At 502 a voltage is ramped, e.g., by a voltage ramp generator 251 in FIG. 2A. The voltage is output to reference cells, e.g., 211-15-R in FIG. 2A, and memory cells, e.g., 211-15-M in FIG. 2B, at 504, and also to a converter, e.g., an analog-to-digital converter (ADC) 260 in FIG. 2A, at 506. The converter can output a converted value, e.g., a digital equivalent of a state for a given voltage, at 508.

If a particular percentage of the reference cells do not conduct at 510, then the voltage ramp continues to increase at 502. If, on the other hand, a particular percentage of the reference cells conduct at 510, then the output of the converter can be adjusted to reflect a desired digital equivalent for a particular state at 512. Simultaneously, at 514, if a selected memory cell conducts for the same voltage that caused a particular percentage of the reference cells to conduct, then the adjusted output of the ADC is detected, e.g., read and latched, as data for the selected memory cell at 516 in data latches, e.g., 266 in FIG. 2B. If the selected memory cell does not conduct at 514, then the voltage continues to increase at 502.

Figure 5B:
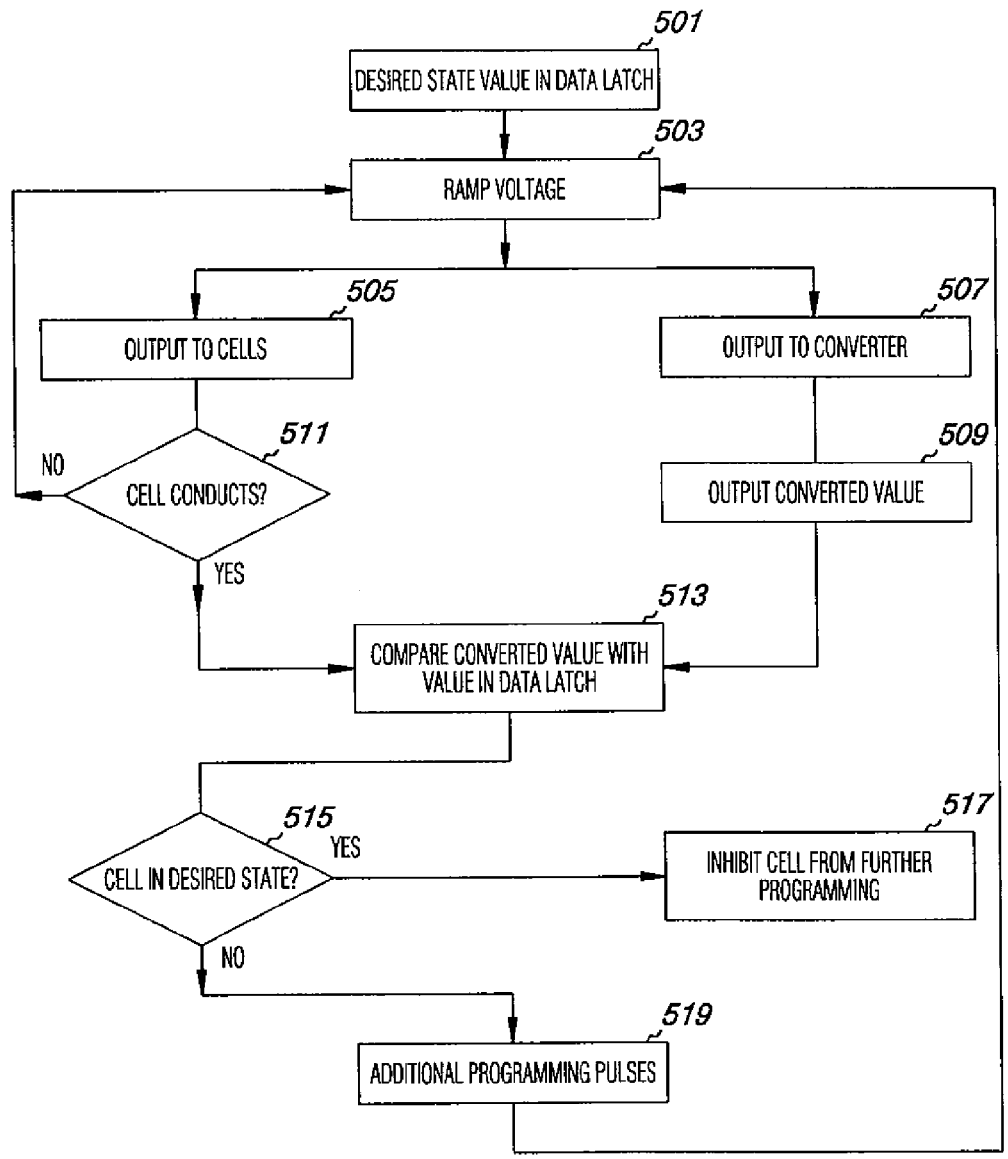
FIG. 5B provides a flow chart illustrating one method for sensing a cell in accordance with one or more embodiments of the present disclosure.

FIG. 5B provides a flow chart illustrating one method for sensing a cell, e.g., 311-15 in FIG. 3, in accordance with one or more embodiments of the present disclosure. A value associated with a state to which a selected memory cell is desired to be programmed is stored in a data latch, e.g., 366-1 in FIG. 3, at 501. At 503 a voltage is ramped, e.g., by a voltage ramp generator 351 in FIG. 3. The voltage is output to cells at 505, and also to a converter, e.g., an analog-to-digital converter (ADC) 360 in FIG. 3, at 507. The converter can output a converted value, e.g., a digital equivalent of a state for a given voltage, at 509.

If a selected cell does not conduct at 511, then the voltage ramp continues to increase at 503. If, on the other hand, the selected cell conducts at 511, then the output of the converter can be compared using a comparator, e.g., 374-1 in FIG. 3, at 513, with the value of the desired state, which was stored in the data latch at 501. If the result of that comparison indicates that the selected cell is in a desired state, e.g., has been programmed to a desired state, then the selected cell is inhibited from further programming pulses at 517. If, on the other hand, the result of the comparison does not indicate that the cell has been programmed to a desired state, then additional programming pulses are applied at 519, and the selected cell can be sensed with an increasing ramp voltage at 503.

Figure 6:
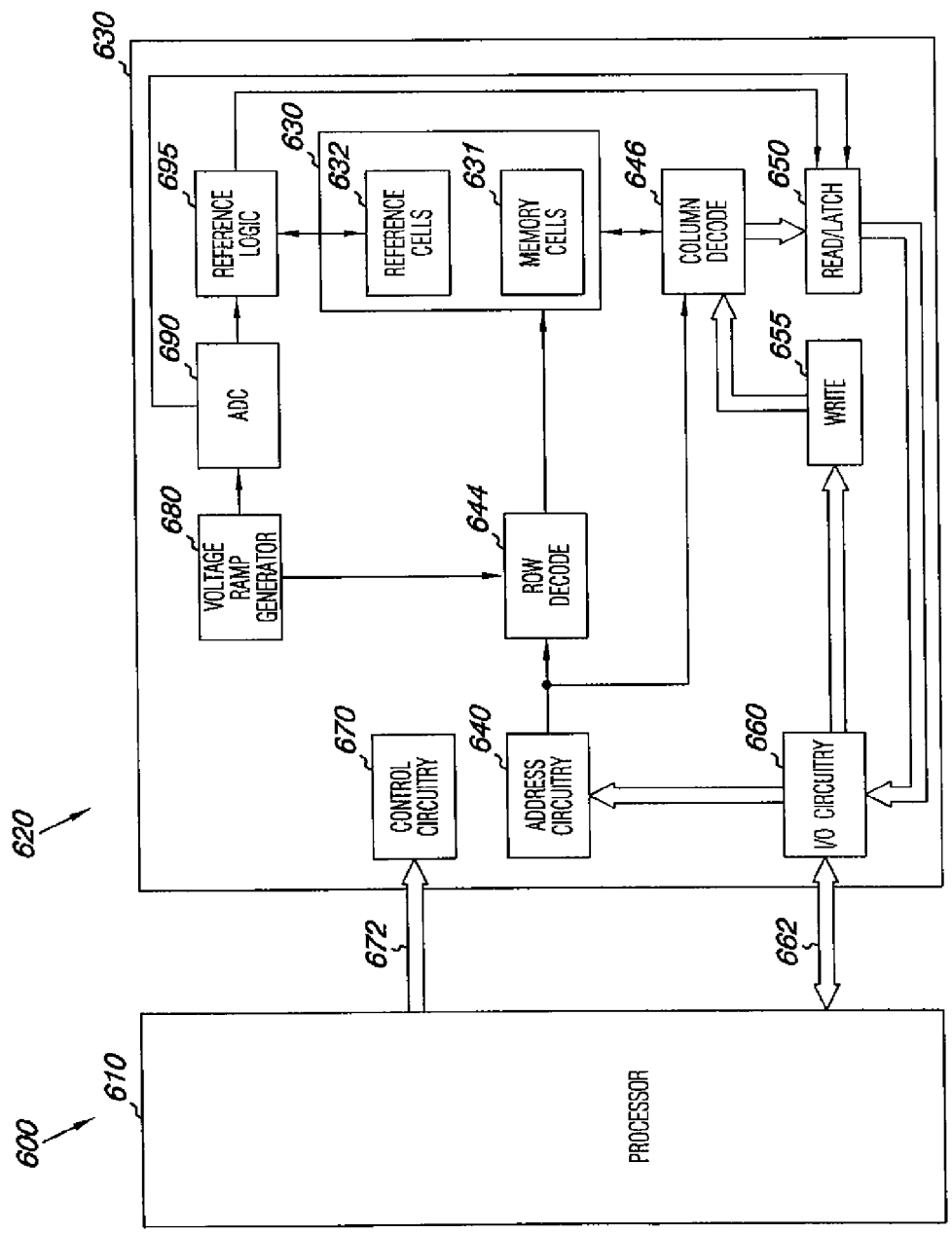
FIG. 6 is a functional block diagram of an electronic memory system having at least one memory device operated in accordance with one or more embodiments of the present disclosure.

FIG. 6 is a functional block diagram of an electronic memory system 600 having at least one memory device 620 operated in accordance with one or more embodiments of the present disclosure. Memory system 600 includes a processor 610 coupled to a non-volatile memory device 620 that includes an array 630 of multilevel non-volatile cells. The array 630 includes both memory cells 631 and reference cells 632. Alternatively, the reference cells 632 could be located outside of the main array 630 as will be understood by one of ordinary skill in the art. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

The memory device 620 includes an array of non-volatile memory cells 630, which can be floating gate flash memory cells with a NAND architecture. The control gates of each row of memory cells are coupled with a select line, while the drain regions of the memory cells are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The array 630 of non-volatile cells can include non-volatile multilevel memory cells having different numbers of program states, sensing voltages, and numbers of digits according to embodiments described herein. The memory device 620 senses data in the array 630 by sensing voltage and/or current changes in the memory array columns using sense/buffer circuitry that in this embodiment can be read/latch circuitry 650. A voltage ramp generator 680 can apply a voltage ramp to the array of cells 630 via row decoder 644. The voltage ramp generator also feeds an analog-to-digital converter (ADC) 690. The ADC can function to convert the output of the ADC and output it to both reference logic 695 and read/latch circuitry 650. The read/latch circuitry 650 can detect, e.g., read and latch, a page or row of data from the array 630. I/O circuitry 660 is included for bi-directional data communication over the I/O connections 662 with the processor 610. Write circuitry 655 is included to write data to the array 630.

Reference logic 695 can have bidirectional communication with reference cells 632. When a particular percentage of reference cells 632 conduct for a given voltage ramp level from voltage ramp generator 680, reference logic 695 can adjust the output of ADC 690 and output it to read/latch circuitry 650 in accordance with at least one embodiment of the present disclosure.

Control circuitry 670 decodes signals provided by control connections 672 from the processor 610. These signals can include chip signals, write enable signals, and address latch signals that are used to control the operations on the array 630, including data sensing, data write, and data erase operations. In some embodiments, the control circuitry 670 is responsible for executing instructions from the processor 610 to perform the operations according to embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
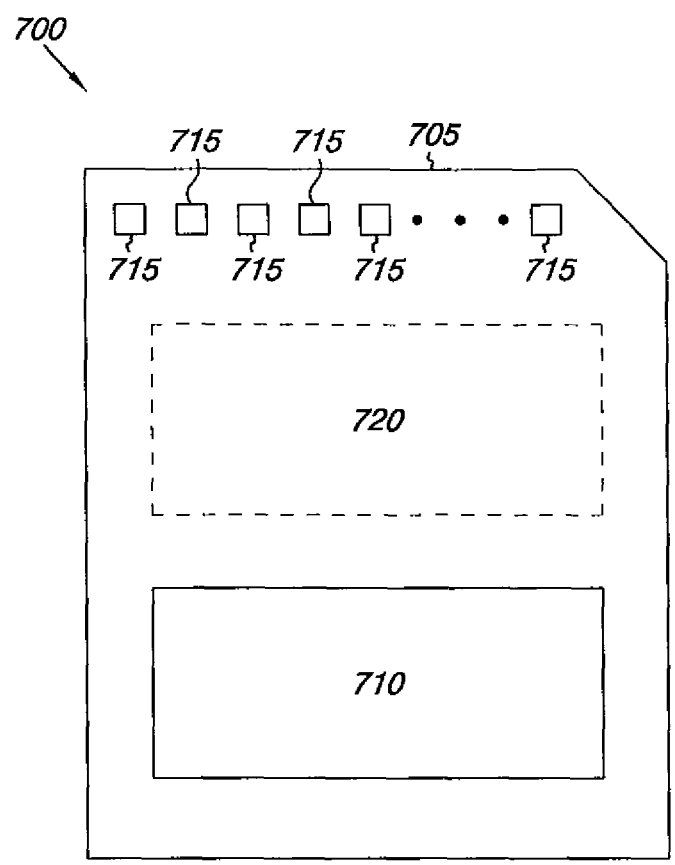
FIG. 7 is a functional block diagram of a memory module having at least one memory device in accordance with one or more embodiments of the present disclosure.

FIG. 7 is a functional block diagram of a memory module having at least one memory device programmed in accordance with one or more embodiments of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of non-volatile multilevel memory cells that can be sensed according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include control circuitry, such as a memory controller, for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices, modules, and systems for operating memory cells have been shown. One method embodiment includes applying a ramping voltage to a control gate of a memory cell and to an analog-to-digital converter (ADC). The aforementioned embodiment of a method also includes detecting an output of the ADC at least partially in response to when the ramping voltage causes the memory cell to trip sense circuitry.

Although specific embodiments have been illustrated and described herein, those of ordinary skill in the art will appreciate that an arrangement calculated to achieve the same results can be substituted for the specific embodiments shown. This disclosure is intended to cover adaptations or variations of some embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the some embodiments of the present disclosure includes other applications in which the above structures and methods are used. Therefore, the scope of some embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory cell, comprising:
applying a ramping signal to the memory cell;
applying the ramping signal to an analog-to-digital converter (ADC);
detecting an output of the ADC at least partially in response to the ramping signal causing the memory cell to conduct;

comparing the detected output of the ADC to data in a data latch associated with the memory cell; and inhibiting the memory cell from programming at least partially in response to the comparison of the detected output of the ADC to data in the data latch indicating that the memory cell stores a desired charge.

2. The method of claim 1, wherein detecting the output includes latching the output of the ADC as data.

3. The method of claim 1, wherein the method includes applying the ramping signal to a number of reference cells for each state.

4. The method of claim 3, wherein the number of reference cells were programmed to each state at substantially the same time as memory cells programmed to each state.

5. The method of claim 3, wherein the method includes adjusting the detected output of the ADC to reflect a digital equivalent of a particular state at a point in time when the ramping signal causes a particular percentage of a number of reference cells programmed to the particular state to trip sense circuitry.

6. The method of claim 5, wherein detecting includes latching the adjusted output of the ADC as data for the memory cell when the memory cell has tripped the sense circuitry for the particular state at the point in time.

7. A method for operating a memory cell, comprising:
applying a ramping signal as an input to:
an analog-to-digital converter (ADC);
at least one selected memory cell; and
a number of reference cells for a each of a number of states;
adjusting the ADC output according to a reaction of the number of reference cells for a particular state to the ramping signal; and
latching the adjusted output of the ADC as data for at least one selected memory cell at least partially in response to the ramping signal causing the at least one selected memory cell to conduct.

8. The method of claim 7, wherein the method includes adjusting the ADC output to reflect a digital equivalent of a program state.

9. The method of claim 7, wherein the method includes adjusting the ADC output at least partially in response to the reaction of a particular percentage of the number of reference cells being conduction.

10. The method of claim 7, wherein the method includes latching the adjusted output of the ADC at substantially the same time as the reaction of the particular percentage of the number of reference cells to the ramping signal.

11. A method for operating a memory cell, comprising:
ramping an input to at least one converter and at least one memory cell;
outputting data from the at least one converter to at least one comparator for the at least one memory cell; and
comparing the at least one converter output comprising a digital value related to a program state with information in a data latch for the at least one memory cell at least partially in response to the ramped signal causing the at least one memory cell to conduct.

12. The method of claim 11, wherein the method includes comparing the at least one converter output with a desired program state, stored as information in the data latch, for the at least one memory cell.

13. The method of claim 11, wherein the method includes inhibiting the at least one memory cell from programming at least partially in response to the memory cell being programmed to a state stored in the data latch.

14. A memory device comprising:
a memory cell including a gate;
a data latch associated with the memory cell;
an analog-to-digital converter (ADC); and
control circuitry coupled to the memory cell, to the data latch, and to the ADC, wherein the control circuitry is configured to:
apply a ramping signal to the gate and to the ADC;
detect an output of the ADC at least partially in response to the ramping signal causing the memory cell to conduct;
compare the output of the ADC to data in the data latch; and
inhibit the memory cell from programming at least partially in response to the comparison of the detected output of the ADC to the data in the data latch indicating that the memory cell stores a desired charge.

15. The memory device of claim 14, wherein the data latch is configured to latch the output of the ADC as data.

16. The memory device of claim 14, wherein the control circuitry is configured to apply the ramping signal to a number of reference cells for each state, wherein the reference cells for each state were programmed at substantially the same time as memory cells programmed to each state.

17. The memory device of claim 16, wherein the control circuitry is configured to adjust the detected output of the ADC to reflect a digital equivalent of a particular state at a point in time when the ramping signal causes a particular percentage of a number of reference cells programmed to the particular state to trip sense circuitry.

18. The memory device of claim 17, wherein the control circuitry is configured to latch the adjusted output of the ADC as data for the memory cell at least partially in response to the memory cell tripping the sense circuitry for the particular state at the point in time.

19. A memory device, comprising:
a number of memory cells;
a data latch associated with at least one of the number of memory cells;
a number of reference cells;
an analog-to-digital converter (ADC); and
control circuitry coupled to the number of memory cells, to the number of reference cells, and to the ADC, wherein the control circuitry is configured to:
adjust an output of the ADC at least partially in response to a particular percentage of the number of reference cells achieving a sense point for a particular state;
latch the adjusted ADC output as data for at least one memory cell at least partially in response to the at least one memory cell achieving the sense point; and
compare an unadjusted ADC output with a desired state stored in the data latch at least partially in response to the at least one memory cell achieving the sense point.

20. The memory device of claim 19, wherein the control circuitry is configured to latch the adjusted ADC during a reading operation and to compare the unadjusted ADC with the desired state stored in the latch during a program verify operation.

* * * * *